(12) United States Patent
Shields

(10) Patent No.: US 10,532,582 B2
(45) Date of Patent: Jan. 14, 2020

(54) PRINTING SYSTEMS

(71) Applicant: Hewlett-Packard Development Company, L.P., Fort Collins, CO (US)

(72) Inventor: James P. Shields, Corvallis, OR (US)

(73) Assignee: Hewlett-Packard Development Company, L.P., Spring, TX (US)

( * ) Notice: Subject to any disclaimer, the term of this patent is extended or adjusted under 35 U.S.C. 154(b) by 0 days.

(21) Appl. No.: 16/086,998

(22) PCT Filed: Jul. 19, 2016

(86) PCT No.: PCT/US2016/042974
§ 371 (c)(1),
(2) Date: Sep. 20, 2018

(87) PCT Pub. No.: WO2018/017064
PCT Pub. Date: Jan. 25, 2018

(65) Prior Publication Data
US 2019/0084315 A1 Mar. 21, 2019

(51) Int. Cl.
*B41J 2/21* (2006.01)
*B41J 11/00* (2006.01)
(Continued)

(52) U.S. Cl.
CPC ........... *B41J 2/2107* (2013.01); *B41J 2/2128* (2013.01); *B41J 2/475* (2013.01); *B41J 11/0015* (2013.01);
(Continued)

(58) Field of Classification Search
CPC ........ B41J 2/2107; B41J 2/2128; B41J 2/475; B41J 11/0015; B41M 5/0011
See application file for complete search history.

(56) References Cited

U.S. PATENT DOCUMENTS 5,804,360 A 9/1998 Schell et al.
5,963,230 A 10/1999 Higashino et al.
(Continued)

FOREIGN PATENT DOCUMENTS

DE 4342643 3/1995
EP 2279801 2/2011
(Continued)

OTHER PUBLICATIONS

Pykonen et al., Effects of Atmospheric Pressure Plasma Activation on Inkjet Print Quality, Society for Imaging and Technology, NIP23 and Digital Fabrication, 2007, pp. 404-409.
(Continued)

*Primary Examiner* — Jason S Uhlenhake
(74) *Attorney, Agent, or Firm* — Thorpe North & Western LLP

(57) ABSTRACT

The present disclosure is drawn to printing systems. In one example, a printing system can include a pretreatment head, an inkjet print head, and a post-treatment head. The pretreatment head can include a first plasma generator to apply a plasma treatment to a media substrate. The inkjet print head can be positioned with respect to the pretreatment head to form a printed image on the media substrate after the plasma treatment. The post-treatment head can include a second plasma generator positioned with respect to the inkjet print head to treat the printed image on the media substrate.

15 Claims, 5 Drawing Sheets

(51) Int. Cl.
*H01J 37/32* (2006.01)
*C08F 283/00* (2006.01)
*G03G 7/00* (2006.01)
*G03C 1/76* (2006.01)
*B41J 2/475* (2006.01)
*B41M 5/00* (2006.01)
*B41M 7/00* (2006.01)

(52) U.S. Cl.
CPC ............ *B41M 5/0011* (2013.01); *B41M 7/00* (2013.01); *C08F 283/006* (2013.01); *G03C 1/7614* (2013.01); *G03G 7/004* (2013.01); *G03G 7/0013* (2013.01); *H01J 37/32009* (2013.01)

(56) References Cited

U.S. PATENT DOCUMENTS

| | | | |
|---|---|---|---|
| 6,664,737 B1 | 12/2003 | Berry et al. | |
| 6,800,342 B2 | 10/2004 | Romano et al. | |
| 6,873,052 B2 | 3/2005 | Aoi | |
| 7,150,901 B2 | 12/2006 | Campbell et al. | |
| 7,167,193 B2 | 1/2007 | Goetzke et al. | |
| 7,387,352 B2 | 6/2008 | Florence et al. | |
| 7,455,891 B2 | 11/2008 | Kanz et al. | |
| 7,758,178 B2 | 7/2010 | Saitoh et al. | |
| 8,236,385 B2 | 8/2012 | Yahiaoui et al. | |
| 8,287,116 B2 * | 10/2012 | Cofler | B41J 3/28 347/101 |
| 8,816,211 B2 | 8/2014 | Shukla | |
| 8,967,784 B2 | 3/2015 | Ram et al. | |
| 8,985,758 B2 | 3/2015 | Mettu et al. | |
| 9,108,437 B2 | 8/2015 | Hirose et al. | |
| 9,259,941 B2 | 2/2016 | Watanabe et al. | |
| 9,278,548 B2 | 3/2016 | Matsumoto et al. | |
| 2003/0104140 A1 | 6/2003 | Goodwin et al. | |
| 2006/0003150 A1 | 1/2006 | Braverman et al. | |
| 2006/0022606 A1 | 2/2006 | DeVries et al. | |
| 2006/0257681 A1 | 11/2006 | Wolf et al. | |
| 2007/0159517 A1 | 7/2007 | Hashimoto et al. | |
| 2007/0166479 A1 | 7/2007 | Drake et al. | |
| 2007/0202270 A1 | 8/2007 | Rose et al. | |
| 2010/0028561 A1 | 2/2010 | Dubreuil et al. | |
| 2011/0214828 A1 | 9/2011 | Le Loarer | |
| 2012/0141180 A1 | 7/2012 | Song et al. | |
| 2013/0048601 A1 | 2/2013 | Dryer et al. | |
| 2013/0224450 A1 | 8/2013 | Wingkono et al. | |
| 2013/0260055 A1 | 10/2013 | Shukla | |
| 2013/0278689 A1 | 10/2013 | Sowinski et al. | |
| 2015/0076124 A1 | 3/2015 | Tsubaki et al. | |
| 2015/0077458 A1 | 3/2015 | Osanai et al. | |
| 2015/0116689 A1 | 4/2015 | Lee et al. | |
| 2015/0138287 A1 | 5/2015 | Saitoh | |
| 2015/0251453 A1 | 9/2015 | Nakai et al. | |
| 2015/0336403 A1 | 11/2015 | Saito | |
| 2016/0083839 A1 | 3/2016 | Bright et al. | |
| 2016/0167402 A1 * | 6/2016 | Nakai | B41J 2/01 347/102 |

FOREIGN PATENT DOCUMENTS

| | | |
|---|---|---|
| EP | 2875830 | 5/2015 |
| EP | 2974871 | 1/2016 |
| JP | 2016060157 | 4/2016 |
| JP | 2016060157 A2 * | 4/2016 |
| KR | 20130033218 | 4/2013 |
| KR | 20130075512 | 7/2013 |
| WO | 9735726 | 10/1997 |
| WO | 2006128854 | 12/2006 |
| WO | 2010116041 | 10/2010 |
| WO | 2013132343 | 9/2013 |
| WO | 2016064860 | 4/2016 |
| WO | 2016068983 | 5/2016 |

OTHER PUBLICATIONS

Yousefi et al., Investigation of glow discharge plasma for surface modification of polypropylene, Wiley Online Library, http://onlinelibrary.wiley.com/doi/10.1002/sia.1633/abstract, 2003.

International Search Report dated Apr. 20, 2017 for PCT/US2016/042974, Applicant Hewlett-Packard Development Company, L.P.

* cited by examiner

PRINTING SYSTEMS

BACKGROUND

Inkjet printing often utilizes ink that includes a colorant, such as a pigment, dispersed in a liquid ink vehicle. One challenge often encountered with this type of ink is obtaining high color saturation and optical density of images printed with the ink. When the ink is printed on plain paper, the liquid vehicle can be absorbed into the paper. The colorant can thus be transported with the liquid vehicle into the paper. Because a portion of the colorant is absorbed below the surface of the paper, the printed image may appear washed out, having a low color saturation or optical density. Other problems encountered when printing inkjet inks on plain paper include strike through (e.g., ink may be visible on the non-printed side of the paper), poor edge quality, mottling, and inter-color bleeding. Improving image quality can occur by reducing the negative visual impact of one or more of these problems.

DETAILED DESCRIPTION

The present disclosure is drawn to printing systems employing inkjet inks to print an image on a media substrate and dual plasma generators incorporated in the printing system. A first plasma generator can be used to pretreat a media substrate before printing, and a second plasma generator can be used to treat the printed image after printing.

The plasma pretreatment can modify the surface of the media substrate so that the surface interacts with inkjet ink printed on the surface to improve print quality. In one example, applying a plasma pretreatment to plain paper, even without the use of fixer present (e.g., a digitally printed fixer or an analog fixer coating, such as in ColorLok® paper), can provide a paper substrate that can meet or exceed the print quality achieved using paper with a fixer. For example, the print quality on a plain paper, after plasma pretreatment, can approach, match, or exceed the print quality provided using ColorLok® paper or paper that has a fixative solution applied before printing.

The second plasma generator can be used to treat the printed image. In some examples, the inkjet ink can include a plasma curable component, such as a binder, which can be cured by the plasma treatment. For example, a curable binder can include monomers, oligomers, or polymers that polymerize or crosslink upon exposure to free radicals. The plasma generator can generate free radicals, which interact with the curable binder to begin the polymerization or crosslinking process. In other examples, the second plasma generator can be used in conjunction with a polymerizable overcoat composition. The polymerizable overcoat composition can be injected into the plasma generated by the second plasma generator. Thus, the overcoat composition can polymerize on the printed image and form a protective overcoat over the image.

Figure 1A:
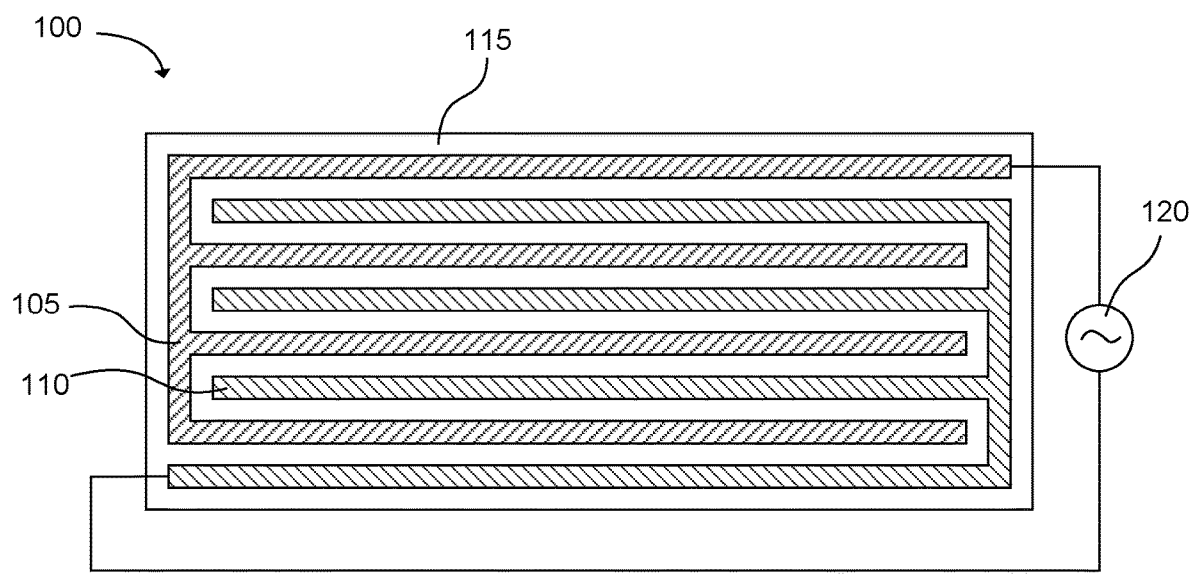
FIG. 1A is a schematic cross-sectional top view of an example surface barrier discharge plasma generator in accordance with examples of the present disclosure.
Figure 1B:
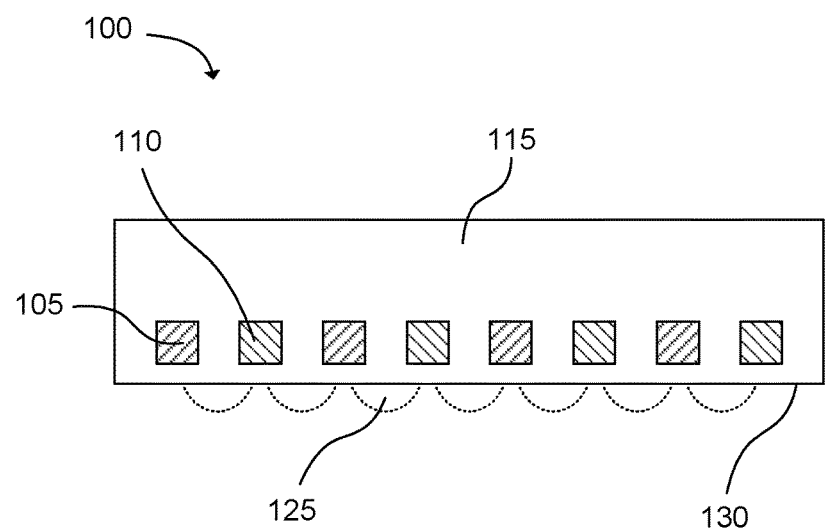
FIG. 1B is a schematic cross-sectional end view of an example surface barrier discharge plasma generator in accordance with examples of the present disclosure.

A variety of types of plasma generators may be used in the printing systems according to the present technology. In some examples, the first and/or second plasma generator described above can be a surface barrier discharge plasma generator. This particular type of plasma generator is a type of dielectric barrier discharge plasma generator, and includes electrodes located beneath a surface of a dielectric material. The electrodes can be separated from each other and from the media substrate by the dielectric material. A high voltage alternating current can be applied across the electrodes to form diffuse plasma arcs on the surface of the dielectric material. FIGS. 1A-1B show an example of a surface barrier discharge plasma generator 100 having a first electrode 105 and a second electrode 110 embedded in a dielectric plate 115. FIG. 1A shows a top cross-sectional view. A power supply 120 applies a potential difference across the first electrode and second electrode. FIG. 1B shows an end cross-sectional view. Plasma arcs 125 can form along the surface 130 of the dielectric plate.

In certain examples, the surface barrier discharge plasma generator can be a coplanar surface barrier discharge plasma generator. For example, the electrodes can be oriented in a common plane beneath the surface of the dielectric material. The surface of the dielectric material can be a flat planar surface. In other examples, the dielectric material can have a curved or other shape, and the electrodes can be oriented beneath the surface to conform to the shape of the surface. For example, the electrodes can be located at an approximately uniform distance beneath the surface.

In some examples, the power supply can provide a high voltage alternating current. In certain examples, the surface barrier discharge plasma generator can be operated at a voltage from 1 kV to 30 kV. In further examples, the high voltage alternating current can have a frequency from 1 kHz to 500 kHz. In one example, the surface barrier discharge plasma generator can be a plasma generator available from ROPLASS S.R.O., such as the RPS40, RPS400, or RPS25x plasma systems.

In some examples, both the first and second plasma generators in the printing system can be surface barrier discharge plasma generators. In such examples, a single power supply can be used to power both plasma generators. The power supply can provide the appropriate voltages and frequencies for the plasma generators to form stable plasma arcs.

As shown in FIG. 1B, the first electrode 105 and second electrode 110 may be oriented in a common plane embedded within the dielectric plate 115. The plasma arcs 125 may be confined to a volume close to the surface 130 of the dielectric plate. For this reason, the plasma arcs in this example can be referred to as a "surface dielectric barrier discharge" which can be generated from a "surface barrier discharge plasma generator" described herein. This is different from a plasma generator that generates a volumetric dielectric barrier discharge. Volumetric dielectric barrier discharge occurs in a volumetric space between two electrodes, rather than from a common surface. In volumetric dielectric barrier discharge plasma systems, electrodes may be oriented in parallel planes, such as two parallel plate electrodes with a dielectric barrier between the electrodes in the space between the electrodes from two different surfaces. Thus, plasma arcs form in the volume between the electrodes. However, in the surface barrier discharge plasma generator 100 shown in FIG. 1B, the plasma arcs occur along a surface that is common to both electrodes of the dielectric plate. This plasma tends to be more homogenous and has a higher energy density than volumetric dielectric barrier discharge plasma. That being described, either type of plasma treatment can be used.

In some examples, the plasma generated by the coplanar dielectric barrier discharge plasma generator can have a depth from 0.1 mm to 5 mm. In other words, the plasma can extend to a distance of 0.1 mm to 5 mm from the surface of the dielectric plate. In further examples, the plasma can have a depth from 0.2 mm to 2 mm or from 0.5 mm to 1 mm. The plasma can have a high energy density, for example from 50 $W/cm^3$ to 250 $W/cm^3$. In further examples, the plasma can have an energy density from 75 $W/cm^3$ to 200 $W/cm^3$ or from 80 $W/cm^3$ to 150 $W/cm^3$. In terms of surface area of the media substrate being treated, the energy density of the plasma can be from 0.5 $W/cm^2$ to 250 $W/cm^2$, from 1 $W/cm^2$ to 50 $W/cm^2$, or from 2 $W/cm^2$ to 10 $W/cm^2$, in some examples.

The plasma generated by the surface barrier discharge plasma generator can be "cold" plasma. For example, the plasma can have a temperature of less than 50° C. Thus, the plasma can safely be used to treat media substrates such as paper without damaging the substrates due to high temperatures.

In further examples, the surface barrier discharge plasma generator can operate at atmospheric pressure in an atmosphere of normal air. Unlike some other types of plasma generators, surface barrier discharge plasma generators in some cases do not require reduced pressure or any special gas flow to operate. For example, some other types of plasma generators employ high gas flows to blow a plasma arc out of a nozzle. The gas required for these systems in some cases includes noble gases such as Argon or Helium. In contrast, the surface barrier discharge plasma generators described herein can be used at normal atmospheric conditions.

In some examples, the surface barrier discharge plasma generator can modify the surface of the media substrate so that the surface has improved interactions with inkjet ink. Specifically, the first plasma generator can modify the surface of media substrate prior to printing an image using the inkjet print head. This plasma pretreatment can result in better print quality of the printed image. Without being bound to a particular mechanism, the plasma treatment can produce highly oxidizing species such as atomic oxygen and OH radicals. These species can react with components in the media substrate to form oxygen-containing groups such as —OH groups and carbonyl groups. In certain examples, the plasma treatment can modify the surface of the media substrate without significantly changing the pH of the surface. In other words, the plasma treatment can modify the surface by forming certain oxygen-containing groups, but without forming a substantial quantity of acid groups on the surface.

In further examples, the surface barrier discharge plasma generator can also have the effect of forming cationic species in the surface of the media substrate, depending on the type of media substrate used. For example, many types of paper contain calcium carbonate, which is added when the paper is manufactured. The plasma treatment can in some cases convert the calcium carbonate into calcium ions. For example, the calcium carbonate can in some examples react to form $Ca^{2+}$ and $CO_2$. In further examples, the calcium carbonate can react via a series of reactions with nitrogen in the air to form calcium nitrate. Unlike calcium carbonate, which is insoluble in water, calcium nitrate is soluble in water and can supply $Ca^{2+}$ ions when an aqueous ink is printed on the surface. The $Ca^{2+}$ ions can act as a fixer when the ink is printed on the surface. In still further examples, the media substrate may include other components that can be converted into cationic species by the plasma treatment. Regardless of whether these chemical reactions occur or not in each and every case, irrespective of the various possible mechanisms, it has been observed that print quality can be improved on a wide variety of papers using the surface barrier discharge plasma generators as described herein.

In other examples, printing systems according to the present technology can employ other types of plasma generators to treat images printed on media substrates. In one example, the plasma generator can include parallel plate plasma with electrodes located on both sides of the media substrate. A dielectric layer can also be positioned between the electrodes. Plasma can form in the volume between the electrodes when a high voltage, high frequency current is applied to the electrodes.

Figure 2A:
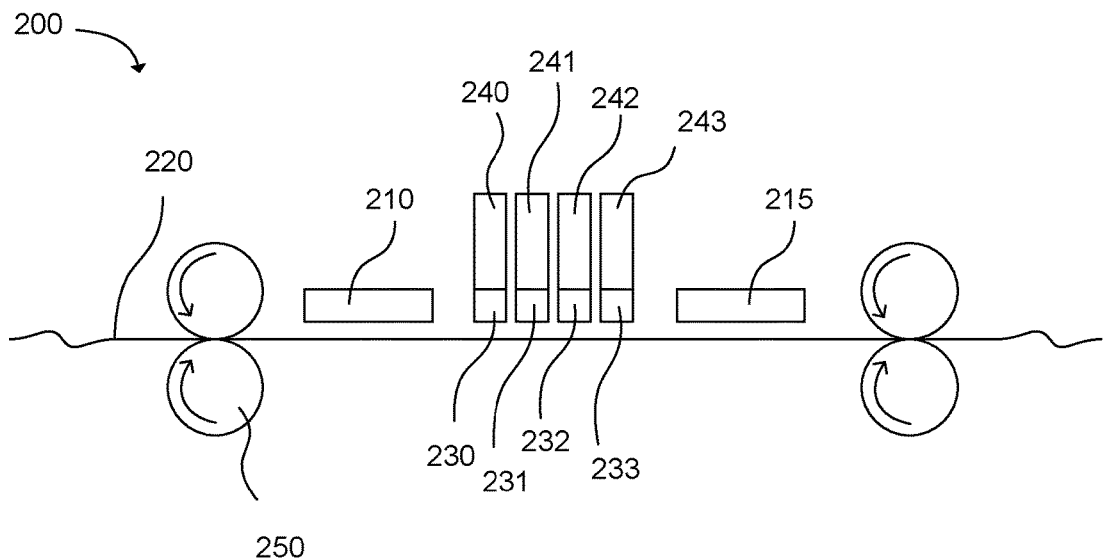
FIG. 2A is a schematic side view of an example printing system in accordance with examples of the present disclosure.

With this description in mind, FIG. 2A shows a schematic side view of a printing system 200 in accordance with examples of the present disclosure. The printing system includes inkjet print heads 230, 231, 232, 233. The inkjet print heads are positioned to print an image on a media substrate 220. The inkjet print heads can be used to print different colors, such as cyan, magenta, yellow, black, blue, green, red, purple, orange, gray, etc. In certain examples, the colors may be cyan, magenta, and yellow (three colors); or cyan, magenta, yellow, and black (four colors). The inkjet print heads may also be in fluid communication with ink reservoirs 240, 241, 242, 243, and may carry the inks. The media substrate, as shown, can be conveyed past the pretreatment head and the inkjet print heads by conveyors 250. A pretreatment head 210 including a first plasma generator can be positioned with respect to the inkjet print heads to pretreat the media substrate before the inkjet print heads print the image onto the media substrate. A post-treatment head 215 including a second plasma generator can be positioned to treat the printed image after the image has been applied to the media substrate.

As shown in FIG. 2A, the inkjet print heads 230, 231, 232, and 233 and plasma generators can be positioned a small distance above the surface of the media substrate 220. The inkjet print heads can be positioned at a distance typically used in inkjet printing. In various examples, the plasma generators can be positioned over a range of distances from the media substrate. In one example, the plasma generators can be positioned up to 10 mm from the surface of the media substrate. For example, the plasma generators can be from 0.1 mm to 10 mm from the surface of the media substrate. Depending on the distance of the plasma generators from the media substrate, the media substrate can be within the plasma arcs or beneath the plasma arcs. In some examples, media substrate and the printed image on the media substrate can be effectively treated either within the plasma arcs or beneath the plasma arcs. In further examples, the plasma generator can be fixed at a distance from the media substrate, or moveable with respect to the media substrate so that the distance can be adjusted.

In some examples, the first and/or second plasma generator can be in direct contact with the media substrate. In a further example, the first plasma generator can be in direct contact with the media substrate to pretreat the media substrate, but the second plasma generator can be positioned a distance away from the media substrate to avoid rubbing or smudging the printed image.

Figure 2B:
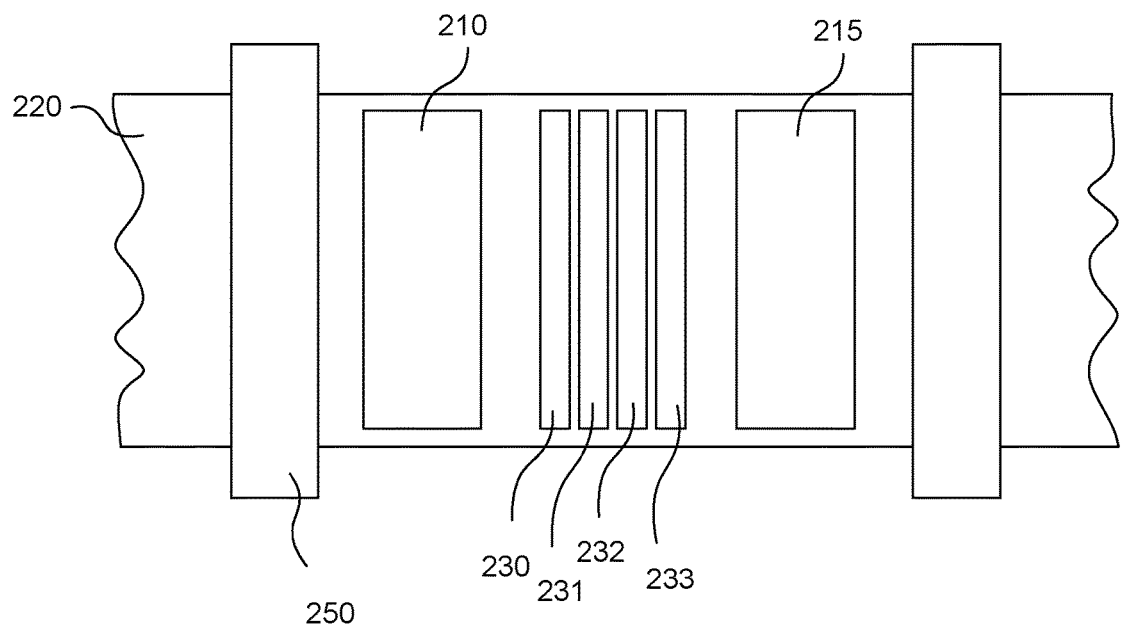
FIG. 2B is a schematic top view of an example printing system in accordance with examples of the present disclosure.

FIG. 2B shows a schematic top view of the printing system of FIG. 2A. As shown in FIG. 2B, the inkjet print heads 230, 231, 232, 233 and plasma generators 210 and 215 can have nearly the same width as the media substrate 220. In certain examples, the plasma generators can be 75% or more as wide as the media substrate, or 90% or more as wide as the media substrate. In further examples, the plasma generators can be as wide as the media substrate or wider.

In some examples, the inkjet print heads and plasma generators can be held stationary while the media substrate is conveyed past. Thus, in one example, the plasma generators can plasma treat the entire width of the media substrate or a portion of the media substrate as wide as the plasma generators. In other examples, it may be that the plasma generators and/or the inkjet print heads may also be movable on a carriage and traverse the media substrate. In other words, in the example shown, these features are static, but they may alternatively be movable.

In some examples, the first and second plasma generators can be positioned at a distance from the inkjet print heads. The plasma pretreatment applied by the first plasma generator can effectively modify the surface of the media substrate very quickly, so that distance between the pretreatment plasma generator and the inkjet print heads is not particularly limiting, e.g., many different distances can be used. Additionally, the plasma treatment can retain its effect on the surface of the media substrate for an extended time, such as more than one month or more than one year. Thus, no particular proximity of distance or time between use of the pretreatment head and the inks impact the result. However, in some examples, the pretreatment head can be positioned directly adjacent to the inkjet print heads. In other examples, the pretreatment head can be positioned any convenient distance from the inkjet print heads, such as from 1 mm to 10 meters away from the inkjet print heads. This can provide advantages over printing systems that apply a liquid fixer solution to a media substrate before printing, because such systems often employ a drying zone between the fixer application and the print heads. Such systems can use a drying oven or a long distance between the fixer application and the print heads to allow water and/or other solvents in the fixer solution to evaporate. In some cases, such printing systems run at a slower printing speed to give the fixer solution more time to dry. In contrast, the plasma treatment used in the present technology can be a dry treatment. Therefore, in many examples, no liquid is added to the media substrate and no drying zone is used between the pretreatment head and the inkjet print heads.

The distance between the inkjet print heads and the second plasma generator can be sufficient to allow the printed image to partially or fully dry before the image is plasma treated. In some examples, a curable inkjet ink can produce a stronger cure when the ink has been allowed to dry. However, other inks may produce a stronger cure if they are cured when still wet. Thus, the position of the plasma generator can be selected based on the characteristics of the ink being employed. In further examples, the printing system can include a dryer or drying zone between the inkjet print heads and the plasma generator. The dryer or drying zone can dry the ink making up the printed image more quickly. For example, a dryer can include a heater to heat the printed image to evaporate water and/or volatile solvents in the ink.

Figure 3:
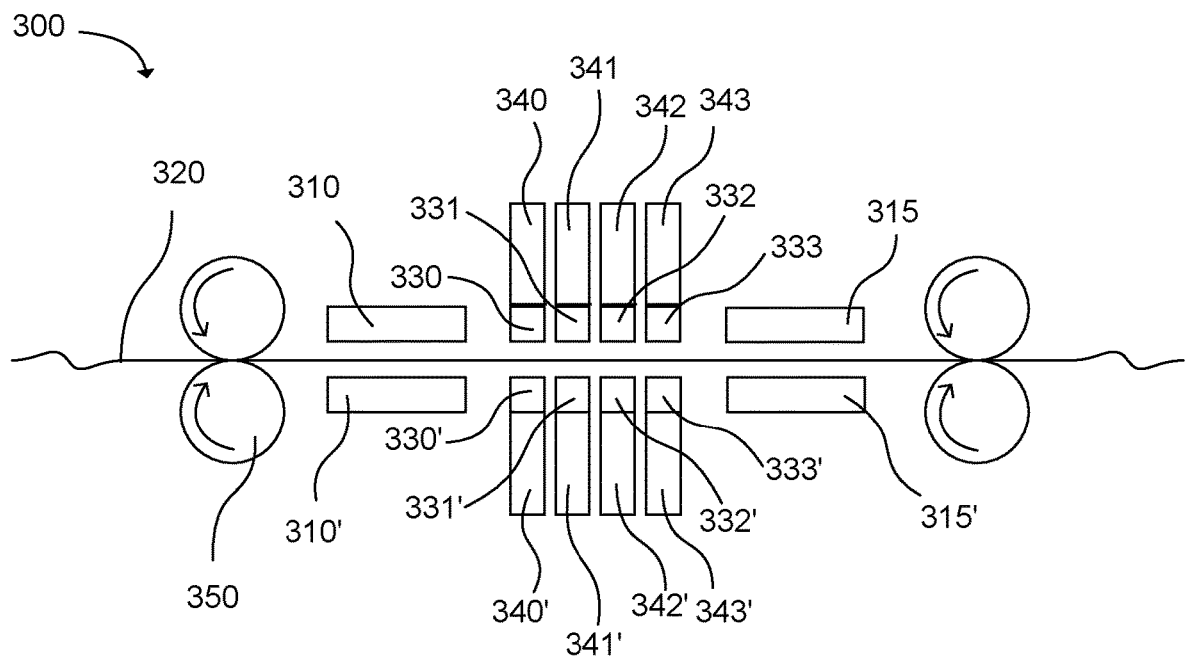
FIG. 3 is a schematic side view of an example printing system in accordance with examples of the present disclosure.

It should be noted that the example shown in FIGS. 2A and 2B is only a single example of the presently disclosed technology. In other examples, printing systems according to the present disclosure can have a variety of different configurations. FIG. 3 shows another example of a printing system 300 that includes inkjet print heads 330, 331, 332, 333 in fluid communication with ink reservoirs 340, 341, 342, 343. A pretreatment head 310 and post-treatment head 315 including plasma generators are positioned before and after the inkjet print heads, respectively. These components are positioned to print on a first surface of the media substrate 320 and plasma treat the media substrate and the printed image. Another set of inkjet print heads 330', 331', 332', 333' in fluid communication with ink reservoirs 340', 341', 342', 343' and another pretreatment head 310' and post-treatment head 315' are positioned on an opposite side of the media substrate to print and treat the opposite surface of the media substrate. The media substrate is conveyed between the two sets inkjet print heads and plasma generators by conveyors 350. Thus, the system can pretreat, print, and post-treat on both surfaces of the media substrate simultaneously.

In other examples, the plasma generators and/or the inkjet print head can be movable with respect to the media substrate. For example, in a web fed printing system the plasma generators and/or inkjet print head can move in a direction perpendicular to the movement direction of the media web. In another example, the printing system can be sheet fed. A media substrate sheet can be fed by conveyors past the plasma generators and inkjet print head, while the plasma generators and/or inkjet print head can move in a direction perpendicular to the movement direction of the media sheet. In a further example, the printing system can have a static printing bed on which a media substrate sheet is placed. The plasma generators and/or the inkjet print head can move in two dimensions (i.e., the x-axis and y-axis directions) over the media substrate sheet to pretreat the media substrate sheet, print on the media substrate sheet, and post-treat the printed image.

Figure 4:
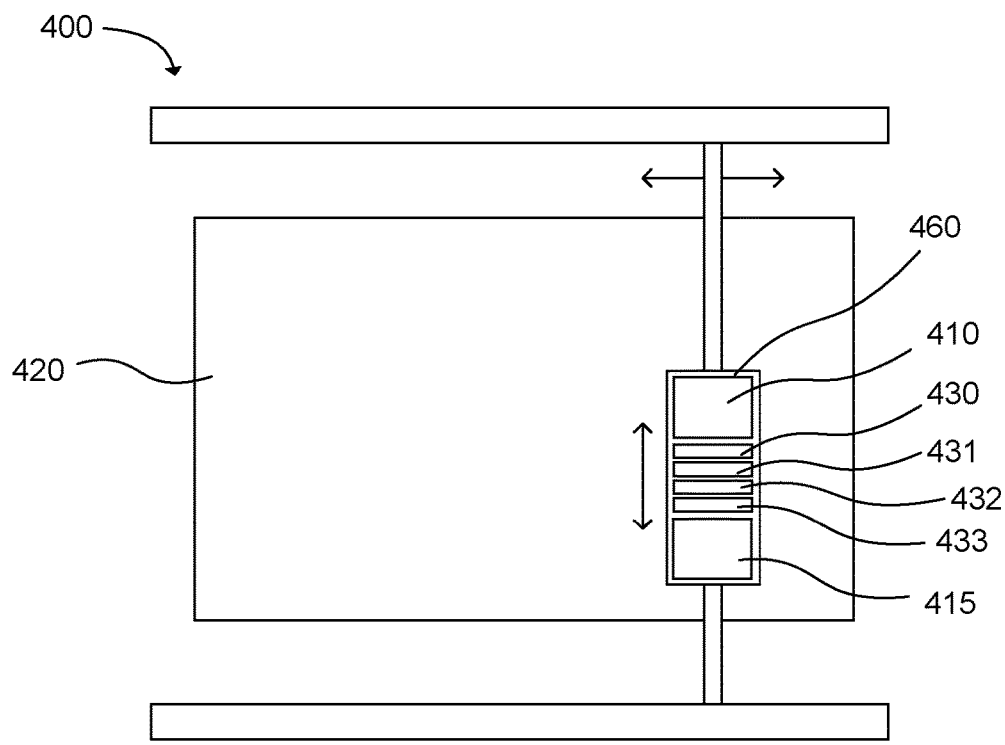
FIG. 4 is a schematic top view of an example printing system in accordance with examples of the present disclosure.

FIG. 4 shows an example of a printing system 400 including a stationary media substrate sheet 420. In this system, a first plasma generator 410, inkjet print heads 430, 431, 432, 433, and a second plasma generator 415 are located together on a carriage 460. The carriage is moveable in the x-axis and y-axis directions. The first plasma generator can pass over an area of the media substrate sheet first to pretreat the area, and then inkjet print heads can pass over the pretreated area to print an image on the pretreated area. Finally, the second plasma generator can pass over the printed image to post-treat the printed image.

As mentioned above, the printing systems described herein can include an inkjet print head. In some examples, a printing system can include a single inkjet print head. The inkjet print head can be in fluid communication with a reservoir of black ink or a colored ink. In other examples, the printing system can include multiple inkjet print heads. For example, the printing system can include an inkjet print head for several different colors, such as cyan, magenta, yellow, and black. In further examples, other colors of ink can be included.

As used herein, "inkjetting" or "jetting" refers to ejecting compositions from jetting architecture, such as inkjet architecture. Inkjet architecture can include thermal, piezo, or continuous inkjet architecture. A thermal inkjet print head can include a resistor that is heated by electric current. Inkjet ink can enter a firing chamber and the resistor can heat the ink sufficiently to form a bubble in the ink. The expansion of the bubble can cause a drop of ink to be ejected from a nozzle connected to the firing chamber. Piezo inkjet print heads are similar, except that instead of a thermal resistor, a piezoelectric element is used to mechanically force a drop of ink out of a nozzle. In a continuous inkjet printing system, a continuous stream of ink droplets is formed and some of the droplets can be selectively deflected by an electrostatic field onto the media substrate. The remaining droplets may be recirculated through the system. Inkjet print heads can be configured to print varying drop sizes such as less than 10 picoliters, less than 20 picoliters, less than 30 picoliters, less than 40 picoliters, less than 50 picoliters, etc.

In some cases, the ink used in the printing systems described herein can be a water-based inkjet ink or a solvent-based inkjet ink. Inkjet inks generally include a colorant dispersed or dissolved in an ink vehicle. As used herein, "liquid vehicle" or "ink vehicle" refers to the liquid fluid in which a colorant is placed to form an ink. A wide variety of ink vehicles may be used with the methods of the present disclosure. Such ink vehicles may include a mixture of a variety of different agents, including, surfactants, solvents, co-solvents, anti-kogation agents, buffers, biocides, sequestering agents, viscosity modifiers, surface-active agents, water, etc.

Generally the colorant discussed herein can include a pigment and/or dye. As used herein, "dye" refers to compounds or molecules that impart color to an ink vehicle. As such, dye includes molecules and compounds that absorb electromagnetic radiation or certain wavelengths thereof. For example, dyes include those that fluoresce and those that absorb certain wavelengths of visible light. In most instances, dyes are water soluble. Furthermore, as used herein, "pigment" generally includes pigment colorants, magnetic particles, aluminas, silicas, and/or other ceramics, organo-metallics or other opaque particles. In one example, the colorant can be a pigment.

In certain examples, the colorant can be a pigment having a dispersing group covalently bonded to surfaces of the pigment. The dispersing groups can be, for example, small groups, oligomeric groups, polymeric groups, or combinations thereof. In other examples, the pigment can be dispersed with a separate dispersant. Suitable pigments include, but are not limited to, the following pigments available from BASF: Paliogen® Orange, Heliogen® Blue L 6901F, Heliogen® Blue NBD 7010, Heliogen® Blue K 7090, Heliogen® Blue L 7101F, Paliogen® Blue L 6470, Heliogen® Green K 8683, and Heliogen® Green L 9140. The following black pigments are available from Cabot: Monarch® 1400, Monarch® 1300, Monarch® 1100, Monarch® 1000, Monarch® 900, Monarch® 880, Monarch® 800, and Monarch® 700. The following pigments are available from CIBA: Chromophtal® Yellow 3G, Chromophtal® Yellow GR, Chromophtal® Yellow 8G, Igrazin® Yellow 5GT, Igralite® Rubine 4BL, Monastral® Magenta, Monastral® Scarlet, Monastral® Violet R, Monastral® Red B, and Monastral® Violet Maroon B. The following pigments are available from Degussa: Printex® U, Printex® V, Printex® 140U, Printex® 140V, Color Black FW 200, Color Black FW 2, Color Black FW 2V, Color Black FW 1, Color Black FW 18, Color Black S 160, Color Black S 170, Special Black 6, Special Black 5, Special Black 4A, and Special Black 4. The following pigment is available from DuPont: Tipure® R-101. The following pigments are available from Heubach: Dalamar® Yellow YT-858-D and Heucophthal Blue G XBT-583D. The following pigments are available from Clariant: Permanent Yellow GR, Permanent Yellow G, Permanent Yellow DHG, Permanent Yellow NCG-71, Permanent Yellow GG, Hansa Yellow RA, Hansa Brilliant Yellow 5GX-02, Hansa Yellow-X, Novoperm® Yellow HR, Novoperm® Yellow FGL, Hansa Brilliant Yellow 10GX, Permanent Yellow G3R-01, Hostaperm® Yellow H4G, Hostaperm® Yellow H3G, Hostaperm® Orange GR, Hostaperm® Scarlet GO, and Permanent Rubine F6B. The following pigments are available from Mobay: Quindo® Magenta, Indofast® Brilliant Scarlet, Quindo® Red R6700, Quindo® Red R6713, and Indofast® Violet. The following pigments are available from Sun Chemical: L74-1357 Yellow, L75-1331 Yellow, and L75-2577 Yellow. The following pigments are available from Columbian: Raven® 7000, Raven® 5750, Raven® 5250, Raven® 5000, and Raven® 3500. The following pigment is available from Sun Chemical: LHD9303 Black. Any other pigment and/or dye can be used that is useful in modifying the color of the ink. Additionally, the colorant can include a white pigment such as titanium dioxide, or other inorganic pigments such as zinc oxide and iron oxide.

In further examples, the ink can include a binder. In some examples, the binder can be a latex polymer. In further examples, the binder can include polymers, copolymers, or combinations thereof. The polymers and copolymers can be formed of styrene, acrylic acid, methacrylic acid, methyl methacrylate, butyl acrylate, divinylbenzene, or combinations thereof. In another example, the binder can be a polyurethane binder.

In some cases the binder can be curable. That is, the binder can be further polymerized or cross-linked after the ink is printed onto the media substrate. In one such example, the binder can include a polymerizable polyurethane. The polymerizable polyurethane can be included in the ink in an amount from 1 wt % to 20 wt % in some examples. In further examples, the polymerizable polyurethane can be water dispersible and the ink can include an aqueous vehicle.

In certain examples, the polymerizable polyurethane binder can be formed from the following components: (a) a diisocyanate (b) a polyol, (c) an acrylate or methacrylate with two or more hydroxyl functional groups, (d) a compound including an ionic group or a group capable of forming an ionic group, and (e) another acrylate or methacrylate, the other acrylate or methacrylate having a hydroxyl functional group or an amino functional group. These components can be selected so that the resulting curable polyurethane binder has a weight average molecular weight (Mw) equal to or less than 5,000, a glass transition temperature (Tg) less than 25° C., a double bond density higher than 1.0, and an acid number ranging from 5 to 30.

In addition, the curable polyurethane binder disclosed herein may have a ratio of isocyanate groups (NCO) to hydroxyl groups (OH) (i.e., NCO:OH ratio) that is greater than 1.8. In another example, the NCO:OH ratio of the curable polyurethane binder is equal to or greater than 2.1. In yet another example, the NCO:OH ratio ranges from about 2.6 to about 2.8. In this NCO:OH ratio, it is to be understood that the number of hydroxyl groups (OH) making up the OH portion of the ratio is not the total number of hydroxyl groups in the polyurethane binder, but rather is determined from the hydroxyl groups of component (b) (polyol), component (c) (acrylate or methacrylate with two or more hydroxyl functional groups), and component (d) (the compound including an ionic group or a group to form an ionic group). As such, the total number of OH groups for the NCO:OH ratio is not based on hydroxyl groups from component (e). While not accounted for in this NCO:OH ratio, it is to be understood that the total number of hydroxyl groups (OH) in the polyurethane binder also includes any hydroxyl groups from component (e).

For component (a), any non-aromatic diisocyanate may be used. In an example, the non-aromatic diisocyanate may be hexamethylene-1,6-(HDI), 2,2,4-trimethyl-hexamethylene-diisocyanate, or a combination thereof. The polyurethane can exclude any other isocyanate. The amount of the non-aromatic diisocyanate within the curable binder dispersion can range from about 20 wt % to about 50 wt % of the total weight of the curable polyurethane. In an example, hexamethylene diisocyanate can make up from about 30 wt % to about 50 wt % of the polyurethane binder.

Turning to component (b), the amount of component (b) (i.e., the polyol) within the curable polyurethane binder dispersion can range from about 10 wt % to about 30 wt % of the total weight of the curable polyurethane. In an example, component (b) (i.e., the polyol) can make up from about 15 wt % to about 25 wt % of the polyurethane binder.

Component (b) can be a polyol. The term "polyol", as used herein, means any product having an average of about 2 or more hydroxyl groups per molecule. Some examples of suitable polyols for component (b) may be part of a first class of polyols. As examples, the first class of polyols has a number average molecular weight ranging from greater than 500 to about 5,000. In any of these examples, component (b) can be a macro-glycol. Examples of suitable polyols of the first class include polyester polyols, polyether polyols, polycarbonate polyols, poly(ethyleneoxide) polyols, polyhydroxy polyester amides, hydroxyl-containing polycaprolactones, hydroxyl-containing acrylic polymers, hydroxyl-containing epoxides, polyhydroxy polycarbonates, polyhydroxy polyacetals, polyhydroxy polythioethers, polysiloxane polyols, ethoxylated polysiloxane polyols, polybutadiene polyols, hydrogenated polybutadiene polyols, polyisobutylene polyols, polyacrylate polyols, halogenated polyesters and polyethers, or mixtures thereof. In an example, the polyol can be poly(propyleneglycol), poly(tetrahydrofuran), poly(ethyleneoxide), a polycarbonate polyol, or a polyester polyol.

Other examples of suitable polyols for component (b) may be part of a second class of polyols. The second class has a number average molecular weight that is 500 or lower. Examples of suitable polyols of the second class include 1,2-propanediol, 1,3-propanediol, 1,2-butanediol, 1,3-butanediol, 1,4-butanediol, 1,5-pentanediol, 3-methylpentane-1,5-diol, 1,6-hexanediol, neopentylglycol, cyclohexane-1,4-dimethanol, 1,2-cyclohexanediol, 1,4-cyclohexanediol, 2-ethyl-3-propylpentanediol, 2,4-dimethylpentanediol, 2-ethyl-2-butylpropanediol, diethyleneglycol, triethyleneglycol, tetraethyleneglycol, dipropyleneglycol, tripropyleneglycol, N-substituted ethanolamines, and mixtures thereof. In an example, the polyol is selected from 1,4-butanediol, 1,5-pentanediol, 3-methylpentane-1,5-diol, 1,6-hexanediol, neopentylglycol, and cyclohexane-1,4-dimethanol, trimethylolpropane, glycerol, or pentaerythritol.

It is to be understood that a combination of any of the listed polyols may be used.

The curable polyurethane binder dispersion may further include component (c). Component (c) includes an acrylate or methacrylate with two or more hydroxyl functional groups. In this example, the acrylate or methacrylate with two or more hydroxyl functional groups is present in an amount ranging from greater than 0 wt % to about 40 wt % based on the total weight of the curable polyurethane.

Some examples of the acrylate or methacrylate with two or more hydroxyl functional groups include those obtained from the reaction of diglycidyl compounds with (meth) acrylic acid. Aliphatic diglycidyl compounds derived from alpha, omega diols having 4 to 12 carbon atoms or from polyoxyalkylenediols (such as polyethylene glycol, polypropylene glycol, or mixtures thereof that contain oxyalkylene groups) may be used. Some specific examples include 1,4-butanediol diglycidyl ether, 1,6-hexanediol diglycidyl ether, cyclohexanedimethanol diglycidyl ether, polyethylene glycol diglycidyl ether, polypropylene glycol diglycidyl ether, hydrogenated bisphenol A diglycidyl ether (BGDA or BADGE), hydrogenated bisphenol F diglycidyl ether, and their ethoxylated and/or propoxylated equivalents. An additional example is 1,6-hexanediylbis[oxy(2-hydroxy-3,1-propanediyl)]bisacrylate. Some commercially available examples include MIRAMAR™ PE-210 and MIRAMAR™ PE-230 (Miwon Chemical).

In further examples, the acrylate or methacrylate with two or more hydroxyl functional groups can include aromatic diglycidyl compounds derived from bisphenol A and bisphenol F. Specifically, bisphenol A diglycidyl ether, bisphenol F diglycidyl ether and their ethoxylated and/or propoxylated equivalents may be used. Diglycidyl esters may also be used, such as diglycidyl phthalate, N,N-diglycidyl aniline, or N,N-diglycidyl-4-glycidyloxyaniline. Some specific examples include a diacrylate ester of bisphenol A diglycidyl ether (BGDA) and a dimethacrylate ester of bisphenol A diglycidyl ether (BGDM).

Component (d) is a compound including an ionic group or a group that is capable of forming an ionic group. The amount of component (d) within the curable binder dispersion ranges from greater than 0 wt % to about 10 wt % based upon the total weight of the curable polyurethane. In an example, component (d) makes up from about 2 wt % to about 6 wt % of the polyurethane binder.

The presence of component (d) assists in the ability of the polyurethane to be dissolved or dispersed in water after ionization with a base. Examples of component (d) may be derived from hydroxy-carboxylic acids having the general formula $(HO)_xQ(COOH)_y$, where Q is a straight or branched hydrocarbon radical containing 1 to 12 carbon atoms, and x and y each independently range from 1 to 3. Examples of suitable hydroxy-carboxylic acids include dimethylol propionic acid (DMPA), dimethylol butanoic acid (DMBA), citric acid, tartaric acid, glycolic acid, lactic acid, malic acid, dihydroxymaleic acid, dihydroxytartaric acid, or mixtures thereof. Hydroxyls or amines containing a sulfonate functional group can also be used as component (d). Examples include taurine and aminoethylaminopropylsulfonate (EPS). Hydroxyls or amines containing a phosphate functional group can also be used as component (d). An example includes glycerol phosphate disodium dehydrate.

Turning now to component (e), component (e) is an acrylate or methacrylate having a hydroxyl functional group or an amino functional group. The amount of component (e) in the curable polyurethane binder dispersion can range from greater than 10 wt % to about 65 wt % based upon the total weight of the curable polyurethane. In an example, component (e) makes up from about 20 wt % to about 50 wt % of the polyurethane binder.

Some examples of component (e) include the esterification products of aliphatic and/or aromatic polyols with acrylic acid or methacrylic acid. These products have a residual OH functionality of about 1. Some of these products also have two or more acrylic functionalities. Examples of component (e) include the partial esterification products of acrylic acid or methacrylic acid with tri-, tetra-, penta- or hexahydric polyols or mixtures thereof. These modified or unmodified polyols are partly esterified with acrylic acid, methacrylic acid or mixtures thereof until the desired residual hydroxyl functionality is reached. Suitable examples include acrylic or the methacrylic esters with linear and branched polyols in which the one or more hydroxyl functionality remains free, such as hydroxyalkylacrylates or hydroxyalkylmethacrylates having 1 to 20 carbon atoms in the alkyl group. Some specific examples include hydroxyethylacrylate (HEA), hydroxyethylmethacrylate (HEMA), hydroxybutylacrylate (HBA), hydroxybutylmethacrylate (HBMA), (3-(acryloxy)-2-hydroxypropylmethacrylate) (AHPMA), glycerol diacrylate, trimethylolpropane diacrylate, pentaerythritoltriacrylate (PETA), ditrimethylolpropane triacrylate (DTPTA), dipentaerythritol pentaacrylate (DPPA), and (poly)ethoxylated and/or (poly)propoxylated equivalents of glycerol diacrylate, trimethylolpropane diacrylate, PETA, DTPTA, or DPPA.

The ink used in the printing systems described herein can also include monomers that can be polymerized by exposure to radicals or other species generated by the plasma generator. In some examples, such polymerizable monomers can be used in addition to a polymerizable polyurethane dispersion as described above. In other examples, the ink can include polymerizable monomers without the polymerizable polyurethane dispersions described above.

In some examples, the ink can include polymerizable monomers that are hydrophobic. In certain examples, the polymerizable monomers can be acrylate monomers, vinyl monomers, or combinations thereof. Examples of acrylate monomers can include 2-phenoxyethyl acrylate, isophoryl acrylate, isodecyl acrylate, tridecyl acrylate, lauryl acrylate, 2-(2-ethoxy-ethoxy)ethyl acrylate, tetrahydrofurfuryl acrylate, isobornyl acrylate, propoxylated acrylate, tetrahydrofurfuryl methacrylate, 2-phenoxyethyl methacrylate, isobornyl methacrylate and combinations thereof. Examples of vinyl monomers can include vinyl caprolactam, vinyl ether and any combinations thereof.

In certain examples, the polymerizable monomer can include vinyl caprolactams, hexanediol diacrylates, trimethylolpropane triacrylates, propoxylated neopentyl glycol diacrylates, ethoxylated bisphenol A diacrylate, tris(2-hydroxyethyl) isocyanurate triacrylate, or combinations thereof.

In further examples, the polymerizable monomers can be water-soluble or water-miscible. In some examples, the monomers can include esters of acrylic or methacrylic acid with polyethylene glycol or with a mono-, di-, tri- or tetra-hydric alcohol derived by ethoxylating a mono-, di, tri- or tetra-hydric aliphatic alcohol of molecular weight less than 200 with ethylene oxide. In further examples, the monomers can include acrylate esters of polyethylene glycols made from a polyethylene glycol having a molecular weight of from about 200 to about 800; or acrylic esters of ethoxylated trimethylolpropane, having from 9 to 30 ethoxylate residues, or from 10 to 20 ethoxylate residues. Other examples can include acrylate esters of polyethylene glycols made from a polyethylene glycol having a molecular weight of from about 200 to about 1500 and acrylic esters of ethoxylated trimethylolpropane having from 9 to 30 ethoxylate residues.

Still further examples of the polymerizable monomers can include polyethylene glycol (600) diacrylate, polyethylene glycol (400) diacrylate, methoxy polyethylene glycol (550) mono-acrylate, polyethylene glycol (6) mono-acrylate, 30 ethoxylated bisphenol-A diacrylate, ethoxylated (20) trimethylopropane-triacrylate, (15) ethoxylated trimethylopropane-triacrylate, tris-tryl phenol 18eo acrylate, glycerol 12eo triacrylate, and combinations thereof. In other examples, the monomers can be ethoxylated tri-methylpropane triacrylates.

Examples of suitable commercially available materials can include the following UV-curable materials available from Sartomer such SR415® (ethoxylated (20) trimethylolpropane-triacrylate), CN435® or SR9015®. Other examples of commercially available water-soluble or dispersible monomers include: CD5500® (methoxy polyethylene glycol (350) mono-methacrylate), CD552® (methoxy polyethylene glycol (550) mono-methacrylate), SR259® (polyethylene glycol (200) diacrylate), SR344® (polyethylene glycol (400) diacrylate), SR603® (polyethylene glycol (400) di-methacrylate), SR610® (polyethylene glycol (600) diacrylate), SR252® (polyethylene glycol (600) di-methacrylate), SR604® (polypropylene glycol mono-methacrylate, SR256® (2-(2-ethoxyethoxy)ethyl acrylate), SR9035 (ethoxylated(15)trimethylolpropane triacrylate), all available from Sartomer; Ebecryl®11 (polyethylene glycol diacrylate), and Ebecryl®12 (polyether triacrylate) available from UCB; Genomer®1251 (polyethylene glycol 400 diacrylate), Genomer®1343 (ethoxylated trimethylolpropane triacrylate), Genomer® 1348 (glycerol-propoxy triacrylate), Genomer®1456 (polyether polyol tetra-acrylate), and diluent 02-645 (ethoxy ethyl acrylate), all available from Rahn.

In still further examples, the monomers can include acrylamides monomers. Representative and non-limiting examples of acrylamide water-soluble or water-miscible monomers include N-(2-hydroxyethyl) acrylamide; N,N'-methylene bis-acrylamides and/or N-isopropyl acrylamides. Commercially available water-soluble or dispersible monomers include, for examples, Flocryl® MBA available from SNF FLOERGER (France); Jarchem® HEAA or Jarchem® NIPAM both available from Jarchem (USA, N.J.).

The ink can further be devoid or substantially devoid of photoinitiators. Because the plasma generator is used to cure the ink, no UV radiation is necessary to cure the ink. Accordingly, the ink does not need to include a photoinitiator. Eliminating the photoinitiator from the ink can provide advantages such as making the ink more stable, increasing the shelf-life of the ink, and so on. Inks that contain curable components and photoinitiators can often undergo premature polymerization if exposed to UV light. Additionally, many photoinitiators are difficult to disperse or dissolve in aqueous ink vehicles. However, the present technology allows for the use of curable ink without a photoinitiator. Therefore, these problems can be avoided.

The ink used in the printing systems described herein can also include a liquid vehicle. In some examples, liquid vehicle formulations that can be used in the ink can include water and one or more co-solvents. The co-solvents can be present in total at from 1 wt % to 50 wt %, depending on the jetting architecture. Further, one or more non-ionic, cationic, and/or anionic surfactants can be present, ranging from 0.01 wt % to 20 wt % (if present). In one example, the surfactant can be present in an amount from 0.1 wt % to 20 wt %. The liquid vehicle can also include dispersants in an amount from 0.1 wt % to 20 wt %. The balance of the formulation can be purified water, or other vehicle components such as biocides, viscosity modifiers, materials for pH adjustment, sequestering agents, preservatives, and the like. In one example, the liquid vehicle can be more than 50 wt % water.

In further examples, the liquid vehicle can be a non-aqueous, solvent-based vehicle. In one example, the liquid vehicle can include ethanol and additional co-solvents. Classes of co-solvents that can be used can include organic co-solvents including aliphatic alcohols, aromatic alcohols, diols, glycol ethers, polyglycol ethers, caprolactams, formamides, acetamides, and long chain alcohols. Examples of such compounds include primary aliphatic alcohols, secondary aliphatic alcohols, 1,2-alcohols, 1,3-alcohols, 1,5-alcohols, ethylene glycol alkyl ethers, propylene glycol alkyl ethers, higher homologs ($C_6$-$C_{12}$) of polyethylene glycol alkyl ethers, N-alkyl caprolactams, unsubstituted caprolactams, both substituted and unsubstituted formamides, both substituted and unsubstituted acetamides, and the like. Specific examples of solvents that can be used include, but are not limited to, 2-pyrrolidinone, N-methylpyrrolidone, 2-hydroxyethyl-2-pyrrolidone, 2-methyl-1,3-propanediol, tetraethylene glycol, 1,6-hexanediol, 1,5-hexanediol and 1,5-pentanediol.

Surfactants that can be included in the ink can include alkyl polyethylene oxides, alkyl phenyl polyethylene oxides, polyethylene oxide block copolymers, acetylenic polyethylene oxides, polyethylene oxide (di)esters, polyethylene oxide amines, protonated polyethylene oxide amines, protonated polyethylene oxide amides, dimethicone copolyols, substituted amine oxides, and the like. Suitable surfactants can include, but are not limited to, liponic esters such as Tergitol™ 15-S-12, Tergitol™ 15-S-7 available from Dow Chemical Company, LEG-1 and LEG-7; Triton™ X-100; Triton™ X-405 available from Dow Chemical Company; LEG-1, and sodium dodecylsulfate.

Various other additives may be employed to enhance the properties of the ink composition for specific applications. Examples of these additives are those added to inhibit the growth of harmful microorganisms. These additives may be biocides, fungicides, and other microbial agents, which are routinely used in ink formulations. Examples of suitable microbial agents include, but are not limited to, NUOSEPT® (Nudex, Inc.), UCARCIDE™ (Union carbide Corp.), VANCIDE® (R. T. Vanderbilt Co.), PROXEL® (ICI America), ACTICIDE® (Thor Specialties Inc.) and combinations thereof. Sequestering agents such as EDTA (ethylenediaminetetraaceticacid) may be included to eliminate the deleterious effects of heavy metal impurities. From 0.001% to 2.0% by weight, for example, can be used. Viscosity modifiers may also be present, as well as other additives known to those skilled in the art to modify properties of the ink as desired. Such additives can be present at from 0.01% to 20% by weight.

In some examples, the inkjet ink can include ingredients in the amounts listed in Table 1:

TABLE 1

| Component | Weight Percent |
| --- | --- |
| Binder | 0.5-10% |
| Biocide | 0-5% |
| Surfactant | 0-10% |
| Anti-kogation agent | 0-5% |

TABLE 1-continued

| Component | Weight Percent |
| --- | --- |
| Colorant | 0.5-10% |
| Organic Co-solvent | 0.1-50% |
| Water* | Balance |

*Note that by "balance," what is meant is that water is used to achieve 100 wt %. Other ingredients other than the ones shown in Table 1 may be present, and water is used to arrive at 100 wt %, regardless of what other ingredients are present.

The media substrate used in the printing system can be any of a wide variety of media substrates. Because the printing system includes the pretreatment head with the first plasma generator to pretreat the media substrate before printing, the media substrate may or may not include fixer or other special ingredients to make the media substrate more compatible with inkjet inks. In one example, the media substrate can be substantially devoid of fixer. In another example, the media substrate can include calcium carbonate. Calcium carbonate does not act as a fixer, but the calcium carbonate can be converted into calcium cations by the plasma treatment, or can otherwise interact with the plasma to improve image quality. The plasma treatment can also be used on paper specially manufactured for inkjet printing. The plasma treatment can potentially further improve the print quality using such paper. In various further examples, the media substrate can be plain paper, photo paper, glossy paper, offset paper, coated paper, textile, or combinations thereof.

Figure 5:
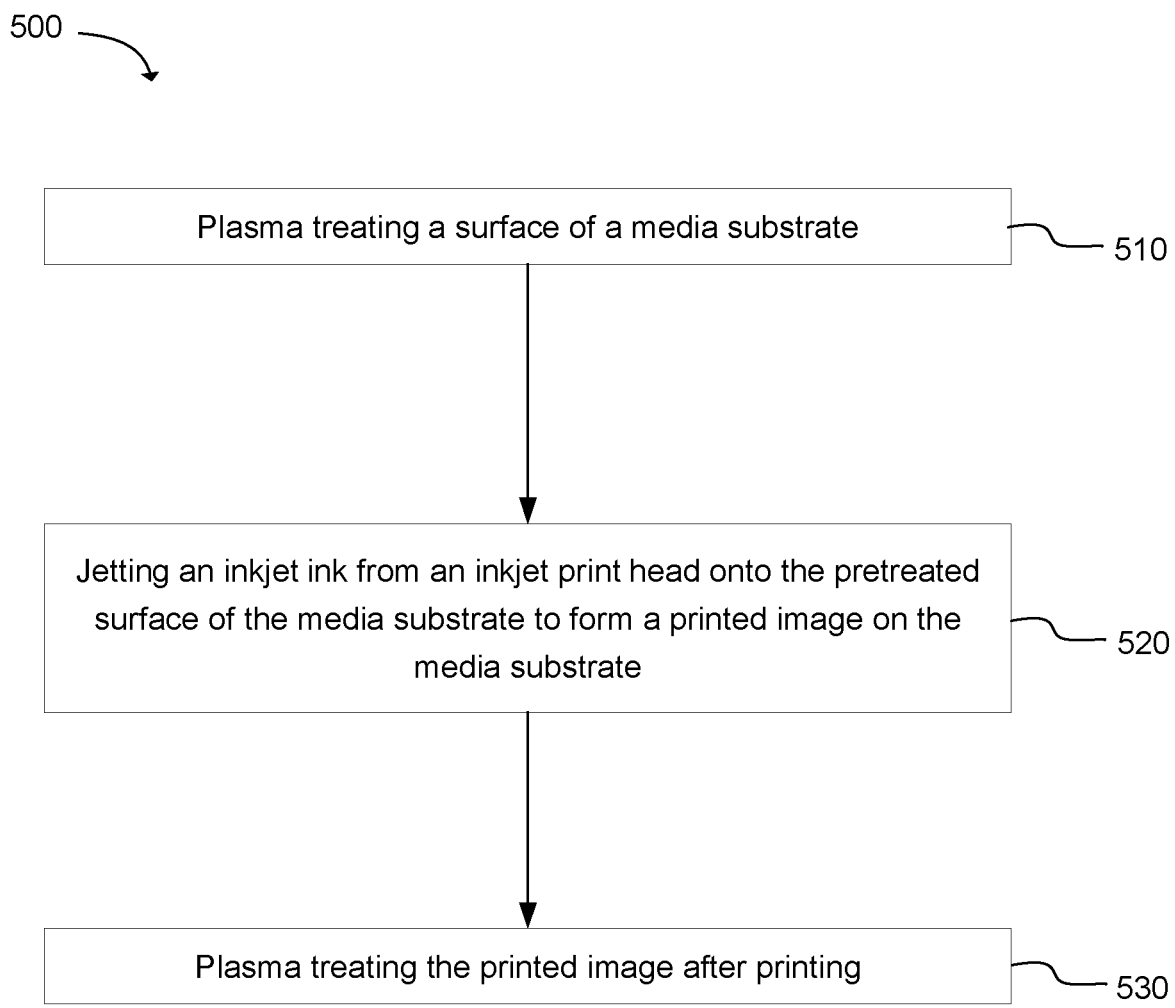
FIG. 5 is a flowchart illustrating an example method of forming a durable printed image on a media substrate in accordance with examples of the present disclosure.

The present disclosure also includes methods of forming a printed image on a media substrate. FIG. 5 shows one example of a method 500 of forming a printed image on a media substrate. The method includes plasma treating a surface of a media substrate 510; jetting an inkjet ink from an inkjet print head onto the pretreated surface of the media substrate to form a printed image on the media substrate 520; and plasma treating the printed image after printing 530.

In some examples, the inkjet ink jetted onto the media substrate can be a pigment-based ink. The ink can include an anionically dispersed pigment, which can interact with the pretreated surface of the media substrate. The cationic species and/or oxygen containing groups on the pretreated surface of the media substrate can cause the anionically dispersed pigment to become destabilized or to "crash out" of solution in the ink. The pigment can then be immobilized at the surface of the media substrate while the liquid vehicle and other components of the ink can be absorbed into the media substrate. This can result in a higher optical density and color saturation compared to printing on a media substrate that has not been pretreated with the plasma treatment. In some examples, the media substrate can be substantially devoid of fixer. Thus, the optical density and color saturation achieved by printing on the plasma treated media substrate can be significantly improved compared to printing on an untreated media substrate In various examples, the plasma pretreatment and/or post-treatment can be performed with a surface barrier discharge plasma generator at a distance from the media substrate up to 10 mm away from the media substrate. For example, the distance between the plasma generator and the media substrate can be small enough that the media substrate passes through the plasma arcs generated by the plasma generator. However, in other examples the distance can be greater than the depth of the plasma arcs so that the plasma arcs are located above the surface of the media substrate.

In further examples, the plasma pretreatment can be performed for a time period of 0.1 second to 20 seconds. In more specific examples, the pretreatment time period can be 0.2 second to 10 seconds or 0.5 second to 5 seconds. In still further examples, the plasma post-treatment can be performed for a time period of 1 second to 20 seconds. In more specific examples, the time period can be 2 second to 10 seconds or 2 second to 5 seconds. As used herein, the time period of the plasma treatments refers to the amount of time that a treated portion of the media substrate is exposed to the plasma. As explained above, the media substrate may be in direct contact with the plasma arc or merely have the plasma arc passed over the media substrate. In the case of a web-fed printing system, the media substrate can constantly move past the surface barrier discharge plasma generator. Thus, the time period of the plasma treatment can be the time required for a point on the media substrate to travel across the length of the plasma generator. In examples where the printing system includes the plasma generator on a carriage, the plasma generator can either be held stationary over a portion of the media substrate for the plasma treatment time period, or the carriage can move at an appropriate speed so that each portion of the media substrate is plasma treated for the appropriate time period.

Generally, longer pretreatment time periods can provide better printing results, as signified by higher optical density and color saturation. However, in some examples a maximum effect can be reached after a certain time period. This time period can be from 0.1 second to 20 seconds or any of the other time periods described above. In further examples, the distance of the plasma generator from the media substrate can affect the time period required to reach the maximum pretreatment effect. At greater distances, a longer time period may be required.

Additionally, longer plasma post-treatment can provide better durability of curable ink. In further examples, the distance of the plasma generator from the media substrate can affect the time period required to reach a given level of durability. At greater distances, a longer time period may be required.

Figure 6:
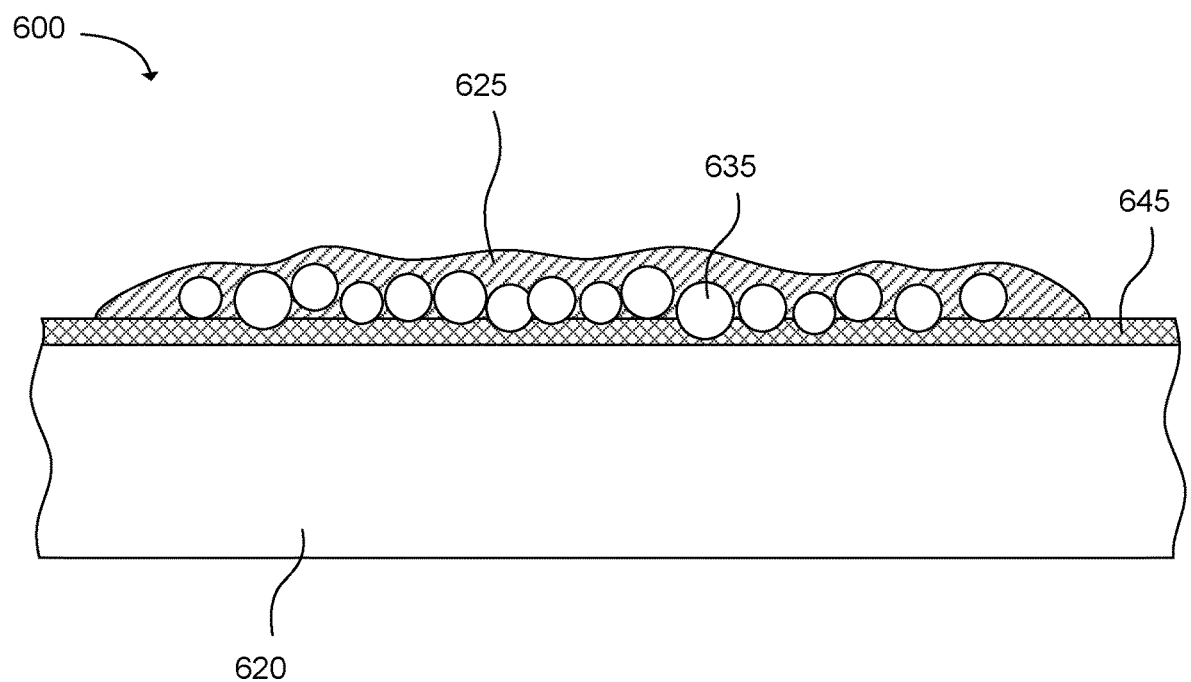
FIG. 6 is a schematic cross-sectional side view of an example printed article in accordance with examples of the present disclosure.

The present disclosure also includes printed articles made using the systems and methods described herein. FIG. 6 shows one example of a printed article 600. The printed article includes a media substrate 620. The media substrate includes a surface 645 that has been modified by a plasma generator before printing to form cationic species, oxygen containing groups, or a combination thereof on the surface. A printed image is formed on the media substrate. The printed image includes an inkjet ink that has been cured by a plasma treatment. In particular, the printed image includes pigment particles 635 in contact with the surface of the media substrate and a polymerized binder 625 over and throughout the pigment particles. The polymerized binder can be a polymerized polyurethane dispersion that has been cross-linked by exposure to free radicals generated by the plasma generator. Additionally, the ink in the printed image can be substantially devoid of photoinitiators.

Figure 7:
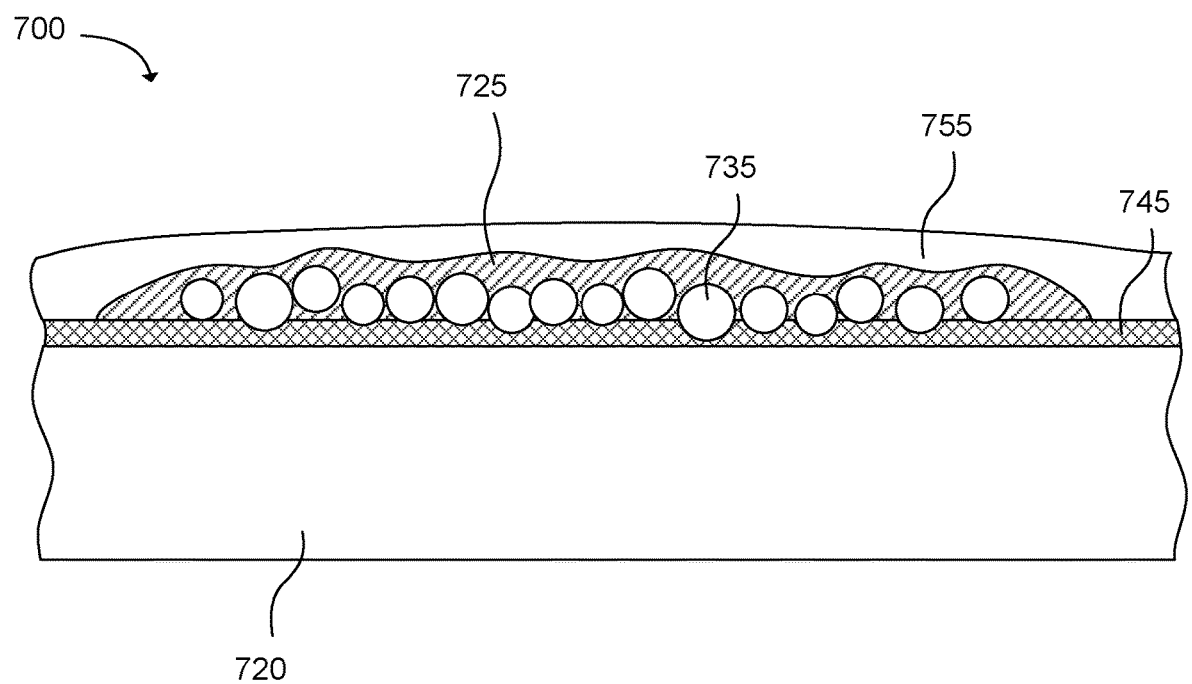
FIG. 7 is a schematic cross-sectional side view of an example printed article in accordance with examples of the present disclosure

FIG. 7 shows another example of a printed article 700. The printed article includes a media substrate 720 having a surface 745 modified by a plasma generator before printing to form cationic species, oxygen containing groups, or a combination thereof on the surface. A printed image is formed by jetting an inkjet ink on the modified surface of the media substrate. The printed image includes pigment particles 735 in contact with the modified surface of the media substrate and a polymerized binder 725 on and throughout the pigment particles. An overcoat layer 755 is coated over the printed image. The overcoat layer can include a polymerizable component that has been polymerized by exposure to the free radicals generated by the second plasma generator.

It is noted that, as used in this specification and the appended claims, the singular forms "a," "an," and "the" include plural referents unless the content clearly dictates otherwise.

As used herein, the term "about" is used to provide flexibility to a numerical range endpoint by providing that a given value may be "a little above" or "a little below" the endpoint. The degree of flexibility of this term can be dictated by the particular variable and can be determined based on experience and the associated description herein.

In this disclosure, "comprises," "comprising," "having," "includes," "including," and the like, and are generally interpreted to be open ended terms. The term "consisting of" is a closed term, and includes only the methods, compositions, components, steps, or the like specifically listed. "Consisting essentially of" or "consists essentially" or the like, when applied to methods, compositions, components, steps, or the like encompassed by the present disclosure, refers to elements like those disclosed herein, but which may contain additional composition components, method steps, etc., that do not materially affect the basic and novel characteristic(s) of the compositions, methods, etc., compared to those of the corresponding compositions, methods, etc., disclosed herein. When using an open ended term, like "comprising" or "including," it is understood that direct support should be afforded also to "consisting essentially of" language as well as "consisting of" language as if stated explicitly, and vice versa.

As used herein, a plurality of items, structural elements, compositional elements, and/or materials may be presented in a common list for convenience. However, these lists should be construed as though each member of the list is individually identified as a separate and unique member. Thus, no individual member of such list should be construed as a de facto equivalent of any other member of the same list solely based on their presentation in a common group without indications to the contrary.

Concentrations, dimensions, amounts, and other numerical data may be presented herein in a range format. It is to be understood that such range format is used merely for convenience and brevity and should be interpreted flexibly to include not only the numerical values explicitly recited as the limits of the range, but also to include all the individual numerical values or sub-ranges encompassed within that range as if each numerical value and sub-range is explicitly recited. For example, a weight ratio range of about 1 wt % to about 20 wt % should be interpreted to include not only the explicitly recited limits of 1 wt % and about 20 wt %, but also to include individual weights such as 2 wt %, 11 wt %, 14 wt %, and sub-ranges such as 10 wt % to 20 wt %, 5 wt % to 15 wt %, etc.

Percentages, ratios, and parts refer to weight percentages, weight ratios, and parts by weight unless otherwise specified or otherwise clear from the surrounding context.

As a further note, in the present disclosure, it is noted that when discussing the printing systems, methods of forming a printed image, and printed articles, each of these discussions can be considered applicable to each of these examples, whether or not they are explicitly discussed in the context of that example. Thus, for example, in discussing details about the printing system per se, such discussion also refers to the methods and the printed articles described herein, and vice versa.

The following examples illustrate aspects of the present technology. However, it is to be understood that these examples are only exemplary or illustrative of the application of the principles of the present systems and methods. Numerous modifications and alternative systems, methods, compositions, media, and so on may be used without departing from the spirit and scope of the present disclosure. The appended claims are intended to cover such modifications and arrangements. Thus, while the technology has been described with particularity, the following examples provide further detail in connection with the present technology.

EXAMPLES

Example 1—Pretreatment

A surface barrier discharge plasma generator was used to treat a media substrate. The plasma generator was model RPS40 from ROPLASS S.R.O. This plasma generator has the following specifications:

TABLE 2

| ROPLASS RPS40 Specifications | |
| --- | --- |
| Power (W) | 40 |
| Plasma Area (cm$^2$) | 7.5 |
| Plasma Depth (cm) | 0.03 |
| Frequency (kHz) | 25 |
| Voltage (kV, peak to peak) | 15 |

A blank sheet of white paper (Hammermill GW30) was treated with the plasma generator for 5 seconds at a distance of 1 mm. After the plasma treatment, a 50% area fill of cyan ink (HP PageWide XL® cyan ink from Hewlett Packard) was printed across the treated and untreated areas. Color saturation, defined as chroma divided by L*, was then measured in the treated area and the untreated area. Color saturation was measured using a GretagMacbeth Spectrolino™ CH9105 color measurement device using D65 illuminant at 2 degrees observer angle and reflectance mode. The untreated area had a color saturation of 0.71 and the treated area had a color saturation of 1.03, which is about a 45% increase in color saturation.

This test was repeated with another sheet of Hammermill GW30 and a magenta ink (HP PageWide XL® magenta ink from Hewlett Packard). The plasma treatment was performed for the same time period at the same distance. After the plasma treatment, a 50% area fill of the magenta ink was printed across the treated and untreated areas. The untreated area had a color saturation of 0.96 and the treated area had a color saturation of 1.52, which is about a 58% increase in color saturation.

Example 2—Post-Treatment

A curable ink was formulated by mixing a curable polyurethane dispersion into HP PageWide XL ink at an amount of 5 wt % with respect to the entire weight of the ink. This ink did not contain a photoinitiator. The ink was printed onto Sterling® Ultragloss media using an inkjet printing system. An area of the printed ink was then cured using the ROPLASS RPS40 plasma generator at a height of 1 mm for 5 seconds. For comparison, another area was left untreated.

The treated and untreated areas were tested by finger rubbing with a wet Texwipe® wipe. The treated area showed very little smudging, while the untreated area showed significant smudging. These results show that the plasma treatment can cure the curable polyurethane in the ink without the presence of a photoinitiator Example 3—Combined Pretreatment and Post-Treatment A blank sheet of white paper is pretreated using a surface barrier discharge plasma generator as described in Example 1. After pretreatment, a curable ink is printed on the paper and the ink is cured using a surface barrier discharge plasma generator as described in Example 2. The final printed image has improved color saturation and durability.

While the disclosure has been described with reference to certain examples, various modifications, changes, omissions, and substitutions can be made without departing from the spirit of the disclosure. It is intended, therefore, that the disclosure be limited only by the scope of the following claims.

What is claimed is:

1. A printing system, comprising:
   a pretreatment head comprising a first plasma generator to apply a plasma treatment to a media substrate;
   an inkjet print head positioned with respect to the pretreatment head to form a printed image on the media substrate after the plasma treatment;
   a post-treatment head comprising a second plasma generator positioned with respect to the inkjet print head to treat the printed image on the media substrate; and
   wherein one or both of the first plasma generator or second plasma generator is a surface barrier discharge plasma generator.

2. The printing system of claim 1, wherein the surface barrier discharge plasma generator includes electrodes beneath a surface of a dielectric material.

3. The printing system of claim 1, further comprising the media substrate, wherein the media substrate is media web that is web fed, and wherein the pretreatment head and the post-treatment head are independently 75% or more as wide as the media web.

4. The printing system of claim 1, further comprising the media substrate, wherein the media substrate is a paper that is substantially devoid of fixer.

5. The printing system of claim 1, further comprising an ink reservoir in fluid communication with the inkjet print head, the ink reservoir comprising a pigment-based inkjet ink, wherein the pigment-based inkjet ink comprises an anionic pigment.

6. The printing system of claim 5, wherein the pigment-based inkjet ink further comprises a polymerizable component capable of polymerizing upon exposure to free radicals.

7. The printing system of claim 6, wherein the polymerizable component is a polymerizable monomer, a polymerizable polyurethane dispersion comprising functional groups that cross-link upon exposure to free radicals, or combinations thereof.

8. The printing system of claim 5, wherein the pigment-based ink is substantially devoid of photoinitiators.

9. The printing system of claim 1, wherein the post-treatment head further comprises an injector to inject a polymerizable overcoat composition into plasma generated by the second plasma generator.

10. A method of forming a printed image on a media substrate, comprising:
    plasma treating a surface of a media substrate;
    jetting an inkjet ink from an inkjet print head onto the pretreated surface of the media substrate to form a printed image on the media substrate; and plasma treating the printed image after printing,
wherein one or both of plasma treating the surface of the media substrate or plasma treating the printed image is performed utilizing a surface barrier discharge plasma generator.

11. The method of claim 10, wherein the surface barrier discharge plasma generator includes electrodes beneath a surface of a dieletric material.

12. The method of claim 10, further comprising injecting a polymerizable overcoat composition into plasma generated to plasma treat the printed image.

13. The method of claim 10, wherein plasma treating the surface of the media substrate and plasma treating the printed image are independently performed for a time period of 0.1 second to 20 seconds.

14. A printed article, comprising:
a media substrate having a surface modified by a first plasma generator to form cationic species, oxygen containing groups, or a combination thereof on the surface; and
a printed image formed by jetting an inkjet ink on the modified surface of the media substrate, wherein the printed image comprises pigment particles in contact with the modified surface of the media substrate, and wherein the inkjet ink comprises a polyurethane dispersion that has been cross-linked by exposure to free radicals generated by a second plasma generator, wherein one or both of the first plasma generator or second plasma generator is a surface barrier discharge plasma generator.

15. The printed article of claim 14, further comprising an overcoat layer over the printed image, wherein the overcoat layer comprises a polymerizable component that has been polymerized by exposure to the free radicals generated by the second plasma generator.

* * * * *